United States Patent [19]
McCall et al.

[11] Patent Number: 5,598,364
[45] Date of Patent: Jan. 28, 1997

[54] ALL-MOS PRECISION DIFFERENTIAL DELAY LINE WITH DELAY A PROGRAMMABLE FRACTION OF A MASTER CLOCK PERIOD

[75] Inventors: Kevin J. McCall, Leominster; Janos Kovacs; Wyn Palmer, both of North Andover, all of Mass.

[73] Assignee: Analog Devices, Inc., Norwood, Mass.

[21] Appl. No.: 560,002

[22] Filed: Nov. 17, 1995

[51] Int. Cl.[6] ................................. G11C 13/00
[52] U.S. Cl. .............. 365/73; 365/76; 365/189.05; 365/203; 365/230.08; 360/51
[58] Field of Search .................. 365/181.05, 203, 365/230.08, 73, 76, 77; 360/51

[56] References Cited

U.S. PATENT DOCUMENTS

| | | | |
|---|---|---|---|
| 4,811,125 | 3/1989 | Sengoku | 360/51 |
| 4,964,107 | 10/1990 | Galbraith et al. | 368/120 |
| 5,414,390 | 5/1995 | Kovacs et al. | 331/2 |

OTHER PUBLICATIONS

Analog Devices, Inc., 1992, Special Linear Reference Manual, pp. 5-29-5-30.
Corey Peterson et al., A 3-5.5V CMOS 32 Mb/s Fully Integrated Read Channel for Disk-Drives, IEEE 1993 Custom Integrated Circuits Conference Proceedings, pp. 10.2.1-10.2.4.

*Primary Examiner*—Terrell W. Fears
*Attorney, Agent, or Firm*—Wolf, Greenfield & Sacks, P.C.

[57] ABSTRACT

A write precompensation circuit includes a plurality of current-controlled delay buffers connected to form a delay line having selectable output taps. The precise delay of each delay buffer is controllable by a secondary control current derived from a master control current such that the precise delay is a precise percent of an oscillator period. The master control current is also used to control the period of a master write clock generated by a current-controlled ring oscillator of delay buffers. A write precompensation method includes steps of controlling current in delay buffers in a current-controlled ring oscillator used to generate a master write clock and current in delay buffers in a current-controlled delay line to maintain delays through delay buffers of the oscillator and the delay line in predetermined proportions to each other.

17 Claims, 4 Drawing Sheets

5,598,364

ALL-MOS PRECISION DIFFERENTIAL DELAY LINE WITH DELAY A PROGRAMMABLE FRACTION OF A MASTER CLOCK PERIOD

FIELD OF THE INVENTION

The present invention relates to circuits and methods which compensate for inherent non-linearities in an information storage channel in which digital data is written into the channel and subsequently read back from the channel at a later time. The information storage channel typically includes a high density disk drive or tape drive magnetic storage device (MSD) on which data written into the channel is held for an indefinite period of time before reading the data back out of the channel. Compensation for non-linearities in a digital data storage channel is generally referred to as "write precompensation" when performed prior to writing the data into the channel.

BACKGROUND OF THE INVENTION

The magnetic recording art has long known that narrow pulses in certain patterns of digital data signals experience pulse compression and other nonlinear pulse-edge displacement effects when stored magnetically on a disk drive or tape drive magnetic storage device (MSD). The resulting data read back from the MSD may have as much as a hundred times higher error rate than expected due to noise alone because the nonlinear pulse-edge displacement effects reduce the data detection system's margin for timing error. If pattern-dependent pulse-edge displacements can be ascertained for a particular medium used in a particular MSD, then it is possible to preshift the write data pulse edges by an amount equal, and opposite in direction to, that in which the medium will shift them, so that data with pulse-edge displacements reduced or eliminated will be read back from the MSD. Write precompensation, as selectively preshifting write data pulses or their edges is known, can decrease error rates enough to allow substantial MSD capacity gains. Particular algorithms for determining which pulse edges to shift are well known, and do not form a part of the present invention.

The capacity improvement obtainable for any algorithm depends strongly upon the accuracy of the time shifts delivered by the write precompensation circuit. The timing of write data pulse edges derives from a master clock. The write precompensation time shifts are typically small relative to the period of the master clock. Furthermore, the write precompensation time shifts should consistently be a specified percentage of the master clock period, which may itself vary due to environmental, process or other causes.

One conventional technique for obtaining time shifts and delays for this purpose is to use resistor-capacitor (RC) timing networks or other analog timing circuits. The performance achievable using this technique is severely limited by component tolerances and environmental factors such as temperature.

Another technique relies upon propagation delays provided by logic gates to determine time intervals of pulse edge shifts. However, logic-gate delays are inherently highly variable with environmental factors and process variations.

The above two techniques also suffer from not being closely tied to the period of the master clock. Therefore, the precompensation produced is one or more fixed time delays, rather than a delay which is a fixed percentage of the master clock, as would be more desirable.

A third method is to synchronize all signals to a write precompensation clock operating at a frequency high enough to allow all precompensation intervals to be specified in integral numbers of cycles of the precompensation clock. The precompensation clock could itself be synchronized with the master clock, for example using frequency synthesis techniques. However, at current disk-drive speeds, the precompensation clock would have to operate at 1 GHz or more. The logic gates, wiring, and shielding necessary for this frequency make this method currently impractical. Although circuit technology might advance to such speeds, advances in recording technology have historically and again in the future will undoubtedly raise the speed requirement at a comparable pace.

SUMMARY OF THE INVENTION

The foregoing problems are solved by various aspects of the present invention.

According to one aspect of the invention, there is provided a write precompensation circuit for producing precompensated write data output in a write data path of a digital data storage channel including a magnetic storage device, the channel including a ring oscillator of N delay buffers having a master clock output, and an amount of write precompensation specified by a digital delay word supplied to the write precompensation circuit. As used in this application, a magnetic storage device (MSD) is an electromechanical device including a magnetic storage medium on which information is stored. The magnetic storage medium and one or more read/write heads are moved relative to each other during the writing and reading processes. A write data path is that pan of the circuitry through which write data passes on the way to being stored on the magnetic storage medium of the MSD. Preprocessing prior to writing the write data onto a magnetic storage medium of the MSD may be performed in the write data path. Write precompensation refers to preprocessing which includes varying the timing of the write data to compensate for non-linearities in the magnetic storage medium or other pans of the MSD which result in read data timing errors. In order to produce various timing signals used in the write data path, there is often provided a master clock signal. In accordance with this aspect of the present invention, the master clock signal is an output of a ring oscillator composed of delay buffers, as described in detail below.

Further, in accordance with this aspect of the invention, the write precompensation circuit includes a delay line of delay buffers, the delay line having an output tap after at least one delay buffer of the delay line and a delay output after at least another delay buffer of the delay line; and a delay word decoder including a select circuit which, as a function of the delay word supplied, selects as precompensated write data output one of the output tap and the delay output. Delay buffers are simply buffer amplifiers designed to have tightly controlled delays from input to output. A delay line is a series connection of two or more delay buffers, where the output of one delay buffer feeds the input of a following delay buffer. By taking outputs from taps where the output of one delay buffer feeds the input of the following delay buffer, various delays can be achieved. The decoders and select circuits used in this aspect of the invention are described in detail below.

Several variations on the first aspect of the invention are possible. For example, the circuit may further include a variable current source generating a master control current wherein the delay buffers of the ring oscillator and the delay buffers of the serial chain have current-controlled delays and each has a delay controlled by the master control current. In another variation, the circuit may further include a digital-to-analog converter (DAC) which receives the master control current and which as a function of the delay word supplied generates a secondary control current which is a predetermined fraction of the master control current wherein at least one of the delay buffers of the serial chain is connected to the secondary control current, to have its delay controlled by the secondary control current. As explained in further detail below, the DAC may use the master control current as a reference, so that the predetermined fraction produced as the secondary control current is precisely controllable. One of a plurality of predetermined fractions of the master control current is selected as the secondary control current by the delay word. In yet another variation in which the circuit selectively produces precompensated write data output and unprecompensated write data output, the circuit may further include a second serial chain of delay buffers having an unprecompensated write data output and a switch connected to the first serial chain of delay buffers and to the second serial chain of delay buffers and producing as an output one of the precompensated write data output and the unprecompensated write data output.

According to a second aspect of the present invention, there is provided a write data precompensation circuit, including a first plurality of current-controlled delay buffers connected as a ring oscillator; a second plurality of current-controlled delay buffers connected as a delay line having taps after at least two of the second plurality of delay buffers, the second plurality of delay buffers being of the same number as the first plurality of delay buffers; a variable source of master control current, the master control current connected to control the delay of the first plurality of delay buffers; and a delay word decoder connected to receive a delay word and to receive the master control current, and having a plurality of select outputs responsive to the delay word received and a secondary control current output which is a function of the master control current and the delay word received, the select outputs connected to control which of the taps is an output tap and the secondary control current output connected to control the delay of the second plurality of delay buffers. This aspect of the invention may also be varied, for example, wherein the delay word decoder further includes a digital-to-analog converter having a transfer function whose discrete output currents are the secondary control currents and wherein the discrete output currents control pairs of the second plurality of delay buffers to have delays which differ from each other by a constant value.

In accordance with yet a third aspect of the invention, a method of performing write precompensation may include the steps of: (1) generating a master write clock using a current-controlled ring oscillator of first delay stages; (2) delaying write data through a plurality of second delay stages having delays which track those of the first delay stages; (3) controlling a current supplied to each second delay stage to be proportional to a current supplied to each first delay stage; and (4) selecting as precompensated write data an output of one of the plurality of delay stages in the step of delaying. Finally, this third aspect of the invention may be varied wherein the step of controlling further includes selecting the current supplied to each second delay stage from one of a plurality of currents which cause delays which differ from each other by equal values.

The present invention may also be embodied in other applications which call for delaying an input data signal by a programmable fraction of a master clock period. Such a circuit for delaying an input data signal may include a current-controlled ring oscillator of delay elements, each delay element controlled by a first control current, the ring oscillator having an output carrying the master clock; a control circuit having a delay code input and a first control current input, the delay code specifying the programmable fraction of the master clock period, and the control circuit producing a second control current output which is a predetermined fraction of the first control current dependent on the delay code input; and a first delay line of delay elements, the first delay line having an input connected to receive the data signal, each delay element of the delay line substantially identical to a delay element of the ring oscillator, each delay element of the delay line controlled by the second control current, the first delay line producing a first delayed output. In one variation, wherein the control circuit further produces a select output, the circuit further includes a second delay line having an input connected to receive the data signal, and including at least one delay element substantially identical to a delay element of the ring oscillator and controlled by a third control current substantially equal to the first control current, the second delay line producing a second delayed output having a fixed delay. The select output of the control circuit then selects as delayed data one of the first delayed output and the second delayed output. In another variation, the ring oscillator is a current-to-frequency circuit in a phase-locked loop circuit. In yet another variation of the circuit for delaying an input data signal, the control circuit further produces a select output, and the first delay line includes a plurality of delay elements having output taps therebetween, an output tap selected as the delayed data signal output by the select output of the control circuit. In the last-mentioned variation of the circuit, the ring oscillator may include an integer number N of delay elements, the first delay line plurality of delay elements is an integer number M of delay elements, and when the first control current equals the second control current the delay between each output tap as a percentage of the master clock period is given by $(\frac{1}{2})(M/N)\cdot 100$. Further, when the delay code input to the control circuit specifies a delay not equal to an integer multiple of $(\frac{1}{2})(M/N)\cdot 100$, the second control current is set to be a predetermined fraction of the first control current other than $\frac{1}{1}$.

A method of delaying input data by a programmable fraction of a master clock period, according to yet another aspect of the present invention may includes the steps of generating input data synchronous with a master clock signal having the master clock period; and selectively delaying the input data by a predetermined delay which tracks the master clock period, the predetermined delay not derived from the master clock signal, thereby delaying the input data by a fixed percentage of the master clock period. The method may further include steps of generating the master clock signal using a predetermined integrated circuit element; and providing a delay circuit having at least one delay element which tracks the master clock period because the delay element has a geometry related to that of the predetermined integrated circuit element.

BRIEF DESCRIPTION OF THE DRAWINGS

Like reference designations indicate like elements in the accompanying drawings, in which.

DETAILED DESCRIPTION

The present invention will be better understood upon reading the following description of an illustrative embodiment along with the accompanying figures.

Figure 1:
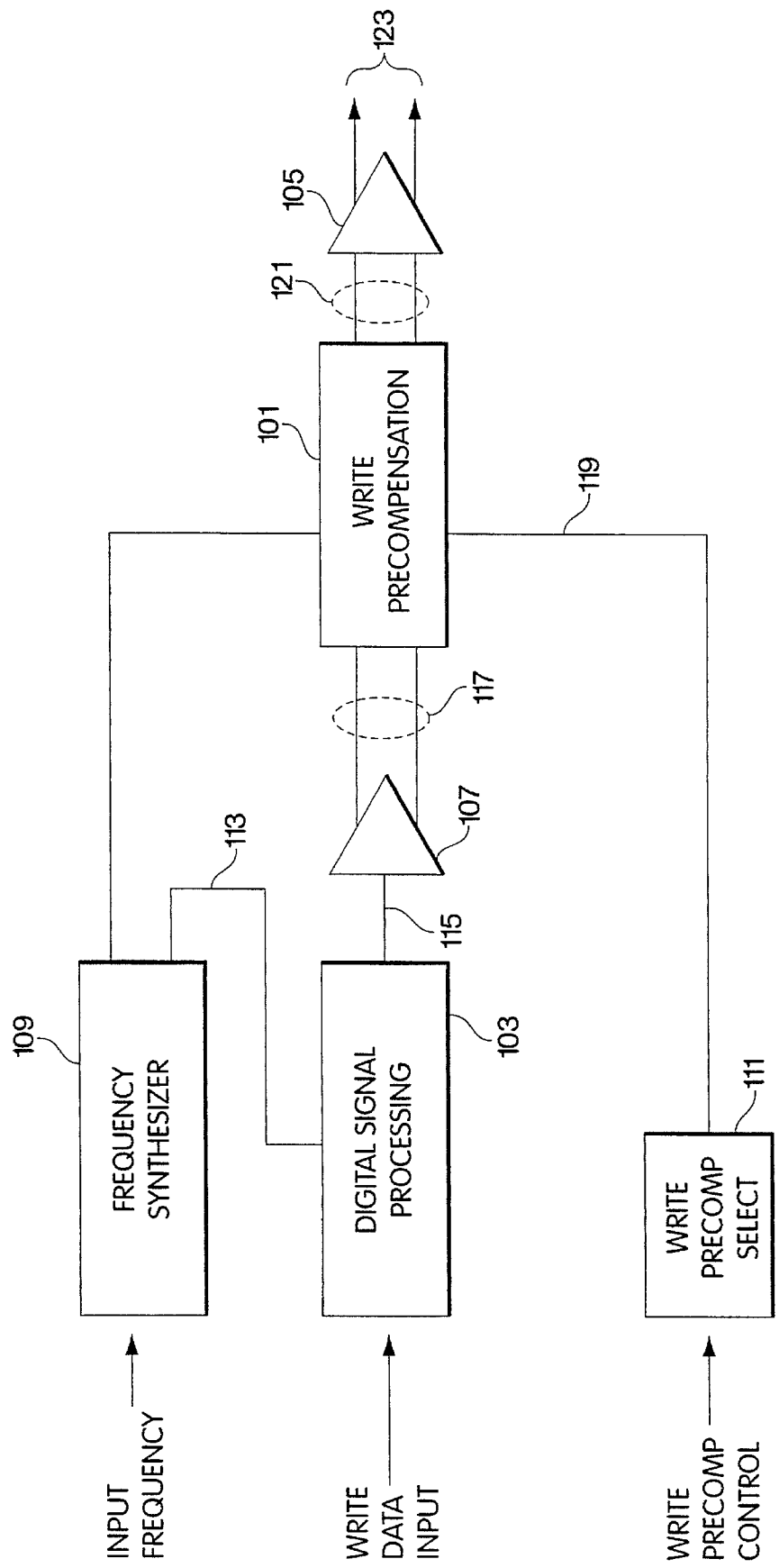
FIG. 1 is a high level block diagram of part of a write channel.

FIG. 1 is a high level block diagram, illustrating the portion of the information storage channel in which circuits in accordance with the present invention may be used. The block diagram shows a portion of the write circuitry comprising the write data path including a write precompensation circuit 101 which may be constructed in accordance with one or more aspects of the present invention.

The portion of the write data path of interest with respect to the present invention includes a digital signal processing circuit 103, the write precompensation circuit 101 and an output driver circuit 105. At various points in the write data path, there may also be employed one or more level converter circuits 107, such as shown connecting the data signal output of the digital signal processing circuit 103 to the write precompensation circuit 101. In addition to the main components of the write data path, the write data circuits may include a frequency synthesizer circuit 109 and write precompensation select circuits 111 for specifying the write precompensation to be applied by write precompensation circuit 101.

In the illustrated system, write data input is received by digital signal processing circuits 103 for preprocessing. This preprocessing is performed synchrononously with a master clock 113 supplied by the frequency synthesizer 109. Preprocessed write data 115 is then level shifted and buffered, if necessary, by level shifter 107. Level shifter 107 may also convert the single-ended preprocessed signal 115 to differential form. At this point, it is advantageous to process write data as a differential write data signal 117.

Write precompensation is performed on the differential write data signal 117. Write precompensation control signals are applied to a write precompensation select circuit 111, which in turn controls operation of write precompensation circuits 101 through one or more signals 119. Signals 119 may control whether write precompensation is applied by write precompensation circuit 101, and if so, how much write precompensation is applied. Write data 121 produced by the write precompensation circuit 101 is buffered by output driver circuit 105 to produce output write data 123. Write data 121 may have precompensation or may not, depending on signals 119.

Figure 2:
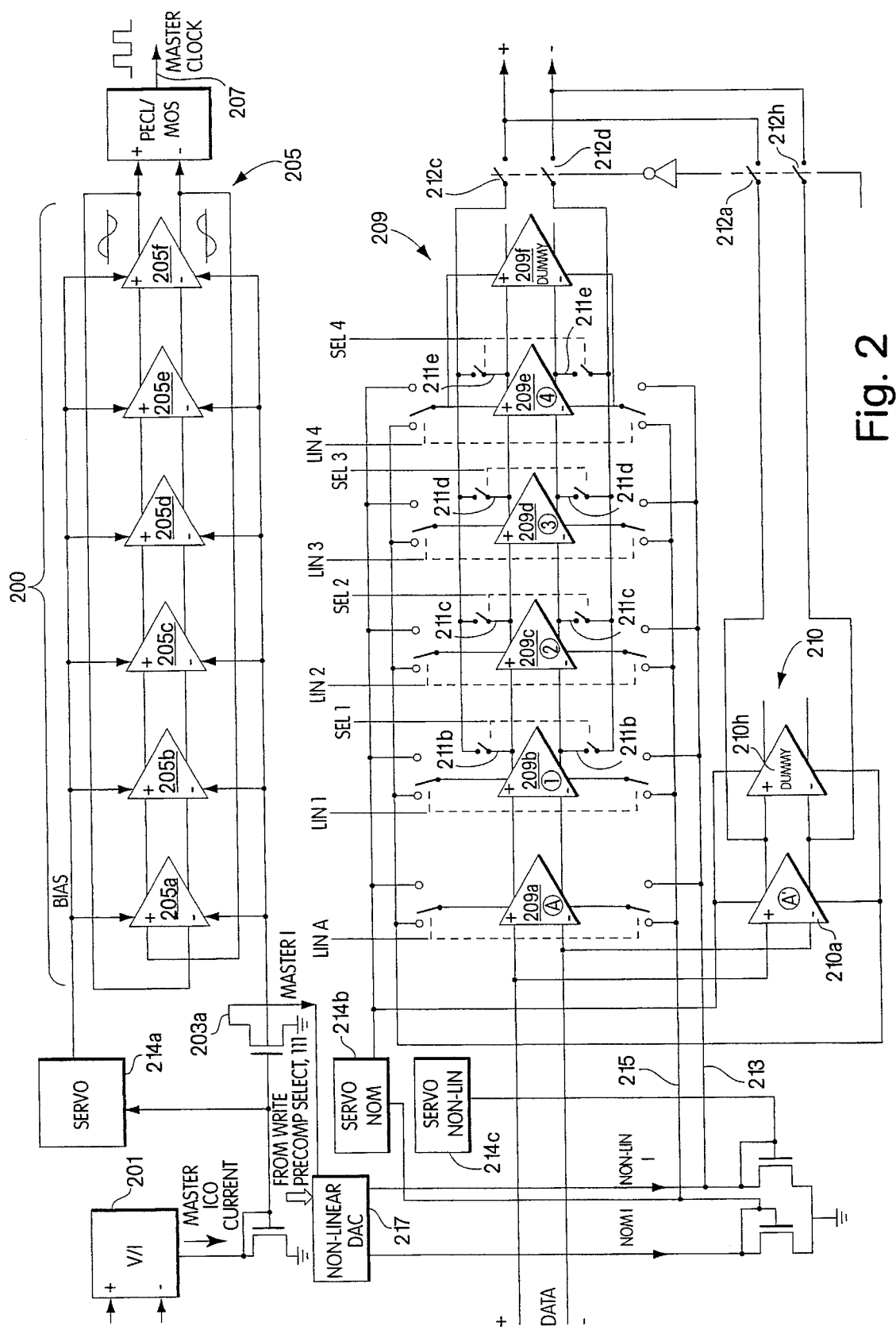
FIG. 2 is a more detailed block diagram of parts of the block diagram of FIG. 1 illustrating one embodiment of aspects of the present invention.

A more detailed block diagram illustrating the write precompensation circuit 101 and relevant portions of the frequency synthesizer circuit 109 and the write precompensation select circuits 111 are illustrated in FIG. 2. Since the frequency synthesizer circuit 109 is not illustrated in its entirety in FIG. 2, it is worth noting at this point that frequency synthesizers are well known to those skilled in this art. Typically, a frequency synthesizer would be implemented as a phase-locked loop in which the phase of an output clock is locked in synchronism with the phase of an input clock. The phases of the output and input clocks are compared and an error signal is generated, which error signal controls the output frequency of a variable frequency oscillator from which the output clock is derived. In the illustrated embodiment of the present invention, a variable current source 201 provides the error signal as a master control current 203. The master control current 203 is a current whose value is related to the difference in phase between the output clock and the input clock.

In accordance with the illustrated embodiment of the present invention, the variable frequency oscillator is a current-controlled ring oscillator 205 composed of six delay buffers 205a–205f, which produce at an output the master clock. A ring oscillator is a well known structure in which a plurality of buffers are connected in series, so as to produce a delay. The output of the last buffer in the series is fed back to the input of the first buffer in the series. An odd number of inversions or 180° phase changes (e.g., one inversion) are made to the signal as it passes through the ring. This causes the ring oscillator to be unstable and to oscillate at a well-defined frequency which is based on the total delay from the first buffer in the series through the last buffer in the series. The time for a signal to propagate once around the ring 205 is one-half cycle of the output clock. In the illustrated, six-buffer ring oscillator 205, the delay through each buffer 205a–205f is 1/12 cycle of the output clock. In the presently described embodiment of the invention, the delay through each buffer 205a–205f in the series is controlled by a mirrored control current generated internally to each buffer 205a–205f and equal to the master control current 203.

Figure 3:
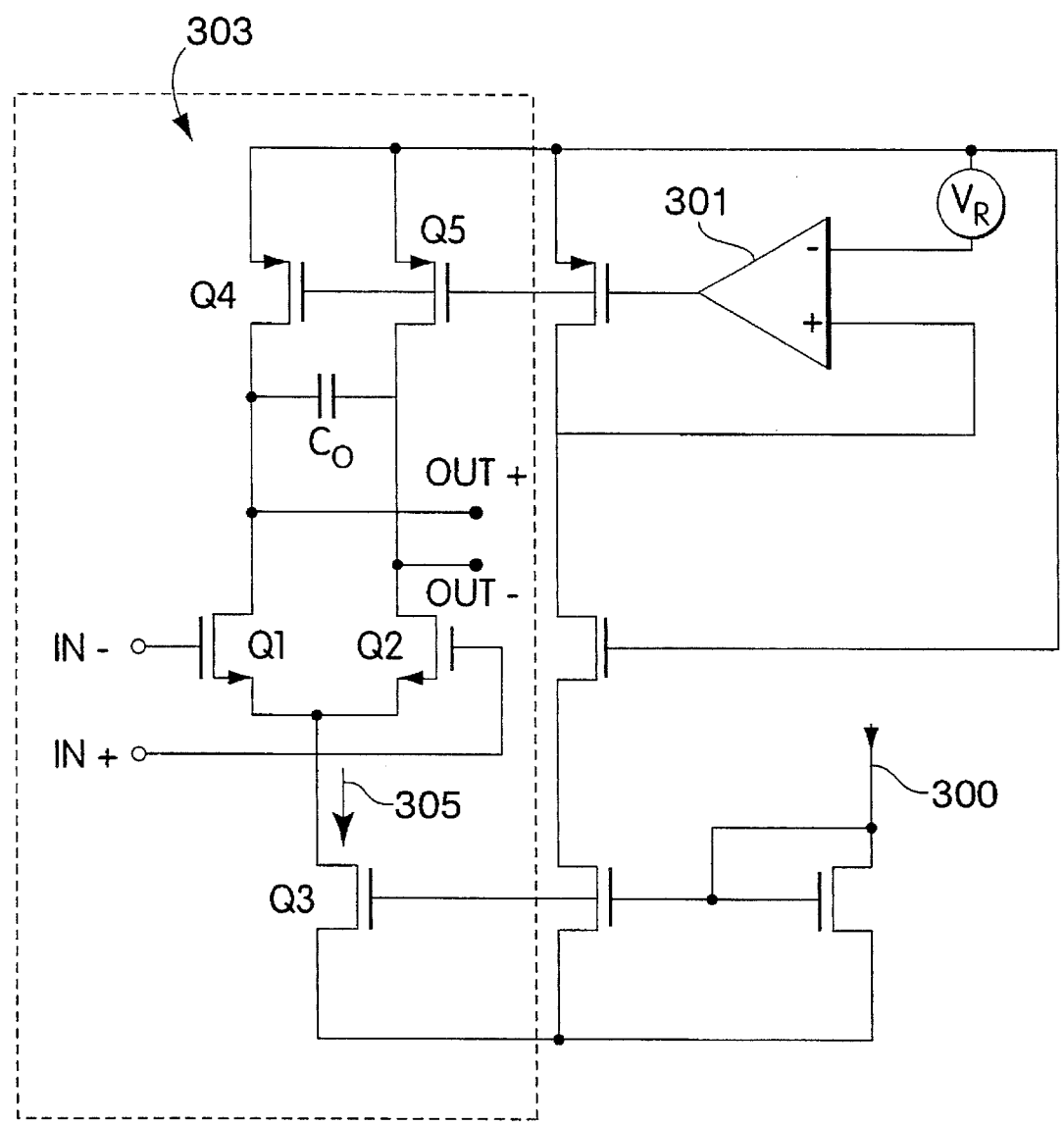
FIG. 3 is a schematic diagram of a typical delay buffer circuit.
Figure 4:
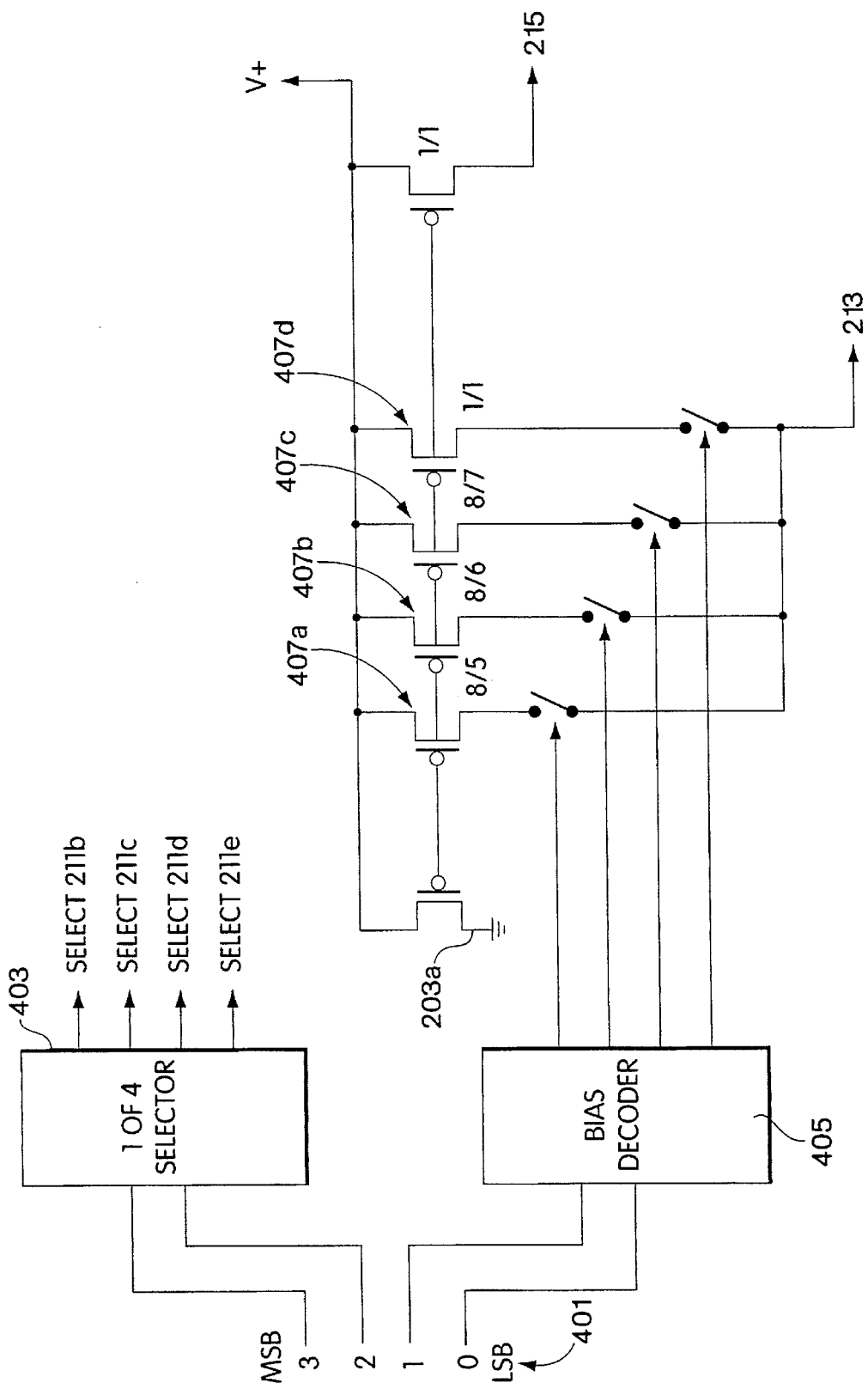
FIG. 4 is a block diagram of the write precompensation select circuits supporting the system of FIGS. 1 and 2.

In order to more fully understand how a control current determines the delay through a delay buffer, attention is now directed to the typical delay buffer circuit or delay cell 303 of FIG. 3. The heart of each delay cell 303 is a differential amplifier including input transistors Q1 and Q2. The control current 300 is mirrored through transistor Q3 to provide a constant bias current 305 to the differential pair Q1 and Q2. The bias current 305 is steered through Q1 and Q2 by the relative inputs to Q1 and Q2. The current path for each of transistors Q1 and Q2 is completed through transistors Q4 and Q5, respectively. Servo circuit 301 biases transistors Q4 and Q5 to each have a resistance $R_{on}(I)$ equal to a reference voltage $V_R$ divided by the value of the control current I300. The delay time constant itself is determined by the output capacitance of input transistors Q1 and Q2 or output capacitor $C_o$ and the resistance $R_{on}(I)$ of transistors Q4 and Q5. For a constant control current, servo circuit 301 maintains Q4 and Q5 at a constant resistance $R_{on}(I)$, despite fluctuations in processing and supply voltage. The delay time constant is thus entirely controlled by and proportional to the control current, as illustrated in equation (1).

$$\text{Delay} = C_O \cdot \frac{V_R}{I_{300}} . \tag{1}$$

Returning to FIG. 2, it is now readily seen that varying the master control current 203 will cause the frequency of master clock 207 produced by the current-controlled oscillator to vary directly proportionately to current, as shown in equation (2). The frequency produced also $$\text{frequency} \propto \frac{1}{\text{Delay}} = \frac{I_{300}}{C_O V_R} . \tag{2}$$

depends on the number of delay elements included in the current-controlled oscillator. Delay lines 209 and 210 are controlled similarly.

In order to provide a stable bias to each delay buffer, as explained above in connection with FIG. 3, servo circuits 214a–214c are provided. Servo circuits 214a–214c perform the same function as servo circuit 301 in FIG. 3.

Delay line 210 comprises two delay buffers, 210a and 210b, substantially identical in structure to delay buffers 205a–205f of ring oscillator 205. At times when no write precompensation is desired, the delay of buffer 210a is applied to all write data as a reference delay. The output of delay line 210 is selected by switches 212a and 212b. Buffer 210a is supplied with a control current which tracks master control current 203, thereby setting the reference delay. In order for the delay time of buffer 210a to be the same function of control current as buffer 205a of the ring oscillator 205, buffer 210a is loaded by dummy buffer 210b.

When write precompensation is to be applied, the output of delay line 209 is selected by switches 212c and 212d. The selection of the output of delay line 209 and of delay line 210 is mutually exclusive. A dummy buffer 209f is provided to load the outputs of buffer 209e, similarly to the loading provided by buffer 210b on buffer 210a. Moreover, when the delay buffers 209a–209f comprising delay line 209 are supplied with a secondary control current 213 equal to the master control current, then the delay through each of the buffers 209a–209f of the delay line 209 has a characteristic delay which is equal to the delay of the corresponding buffers 205a–205f in the ring oscillator 205 because all of delay buffers 209a–209f and 205a–205f are substantially identical. By causing the secondary control current 213 supplied to the ring oscillator 205 to track the control currents supplied to the delay line 209, the delay line 209 produces at each of its output taps 211b–211e a delay proportional to the period of the master clock 207, and which accurately tracks variations in the period of the master clock 207. Tracking is highly accurate because substantially identical delay buffers are used in both the ring oscillator 205 and the delay line 209. One of skill in this art could effect highly accurate tracking by using delay buffers in the delay line 209 which are scaled replicas of delay buffers in the oscillator 205, for example, without departing from the spirit of the invention. The difference in delay from one tap 211b–211e to the next tap 211b–211e of the delay line 209 is 1/12 of the master clock period. This spacing between each of taps 211b–211e occurs for the same reason as discussed above with respect to the delay through each buffer 205a–205f of the ring oscillator 205. However, finer control of the delay selected for write precompensation than 1/12 of the master clock period is required.

Finer control of the delay through the delay line 209 may be accomplished through a non-linear digital-to-analog converter 217 selectively supplying one or more of the buffers 209a–209f of the delay line 209 with a secondary control current 213 which is a precalculated fraction of the master control current 203. Fine control of the delay line is now described.

As previously mentioned, the write data path is supported by write precompensation select circuitry (FIG. 1, 111). One of the select functions is to select the amount of write precompensation applied. A digital delay word 401 indicative of the amount of write precompensation selected is supplied by external circuits (not shown). In the illustrated embodiment, the digital delay word 401 is specified by four bits. The two MSBs (bits 3 and 2) of the digital delay word are applied as inputs to a one-of-four selector 403. The outputs of the one-of-four selector 403 determine which output tap (FIG. 2, 211b–211e) is selected. Output tap selections are made according to Table 1.

The two LSBs (bits 1 and 0) of the digital delay word 401 are applied as inputs to a bias decoder 405, which is a second one-of-four selector included in a non-linear digital-to-analog converter (FIG. 2, 217). The bias decoder 405 selects which of four current mirror transistors 407a–407d supplies the secondary control current 213. Each of the four current mirror transistors 407a–407d mirrors a different predetermined fraction of a replica of the master control current 203a. Thus, the delay buffers 209a–209f of the delay line 209 can be programmed for any of four different delays by selecting one-of-four values for control current 213. Because of this finer control of the delay through each delay buffer 209a–209f, the total delay provided by the delay line 209 may be selected in steps of 1/12×1/4, or 1/48 of the period of the master clock. That is, the delays may be selected in steps of 2.08% of the period of the master clock.

A variation in the delay provided through a single buffer 209a–209f by a factor of 4:1 requires very large variations in the secondary control current 213. In order to improve the linearity of the system and to reduce the sizes of the components necessary to implement the system, it would be desirable to use smaller current variations. But, it is also desirable at large delay values to have some delay buffers of delay line 209 controlled by a current equal to the master control current 203 because they will then better track the delay through each delay buffer of ring oscillator 205 which is controlled by a current equal to master control current 203.

By varying the delays of pairs of delay buffers 209a–209f by a factor of only 1.6:1, a total net variation of 4:1 is achieved according to a preferred technique. One of ordinary skill in this art would be able to vary the delays of adjacent groupings other than pairs of delay buffers 209a–209f in order to vary the relationship between secondary control current range and delay variation. In the present embodiment, the currents provided as the secondary control currents 213 are equal to the master control current, 8/7 of the master control current, 8/6 of the master control current, and 8/5 of the master control current. These secondary control currents 213 are supplied to two delay buffers 209a–209f at a time. A complete table of the taps selected 211b–211e and secondary control currents 213 supplied for each digital delay word 401 appears below, as Table 1. The final (i.e., rightmost) column of Table 1 gives the total delay, as a percentage of the master clock period.

TABLE 1

| Delay Word | Tap Selected | Secondary Control Current | | | | | Delay |
|---|---|---|---|---|---|---|---|
| | | 209a | 209b | 209c | 209d | 209e & 209f | |
| 0000 | X† | X | X | X | X | X | ‡0.00% |
| 0001 | 211b | 8/5 | 8/5 | X | X | X | 2.08% |
| 0010 | 211b | 8/6 | 8/6 | X | X | X | 4.17% |
| 0011 | 211b | 8/7 | 8/7 | X | X | X | 6.25% |
| 0100 | 211b | 1 | 1 | X | X | X | 8.33% |
| 0101 | 211c | 1 | 8/5 | 8/5 | X | X | 10.42% |
| 0110 | 211c | 1 | 8/6 | 8/6 | X | X | 12.50% |
| 0111 | 211c | 1 | 8/7 | 8/7 | X | X | 14.58% |
| 1000 | 211c | 1 | 1 | 1 | X | X | 16.67% |
| 1001 | 211d | 1 | 1 | 8/5 | 8/5 | X | 18.75% |
| 1010 | 211d | 1 | 1 | 8/6 | 8/6 | X | 20.83% |
| 1011 | 211d | 1 | 1 | 8/7 | 8/7 | X | 22.92% |
| 1100 | 211d | 1 | 1 | 1 | 1 | X | 25.02% |
| 1101 | 211e | 1 | 1 | 1 | 8/5 | 8/5 | 27.08% |
| 1110 | 211e | 1 | 1 | 1 | 8/6 | 8/6 | 29.17% |
| 1111 | 211e | 1 | 1 | 1 | 8/7 | 8/7 | 31.25% |

†X = don't care
‡Delay line 209 bypassed by delay line 210.

The present invention has been described and illustrated in connection with a number of specific examples. However, the foregoing description is not to be taken as limiting. Numerous variations and modifications contemplated as within the scope of the invention should now occur to those skilled in the art. For example, the invention may be used outside of the disk drive arts, wherever a delay may be specified as a precise percentage of a master clock. The master clock may be generated by a current-controlled ring oscillator in a phase-locked loop, whereby variations in the master clock are minimized by closed loop control techniques. The master clock frequency may also be varied, but the delay produced by the invention at a fixed setting will remain a constant percentage of the master clock period. Also, the numbers of delay buffers used in the delay line and used in the oscillator may be independently varied as the particular design may require. Therefore, the scope of the invention is not to be limited except by the scope of the appended claims.

What is claimed is:

1. A write precompensation circuit for producing from write data a precompensated write data output in a write data path of a digital data storage channel including a magnetic storage device, the channel including a ring oscillator of at least one delay buffer having a characteristic delay, the ring oscillator having a master clock output, said output having an amount of write precompensation specified by a digital delay word supplied to the write precompensation circuit, the write precompensation circuit comprising:

a serial chain of delay buffers having an input connected to receive the write data, the serial chain having an output tap after at least one delay buffer of the serial chain and a delay output after at least another delay buffer of the serial chain, each delay buffer of the serial chain having a delay which tracks the characteristic delay; and a delay word decoder including a select circuit which as a function of the delay word supplied selects as the precompensated write data output one of the output tap and the delay output.

2. The circuit of claim 1, further comprising:

a variable current source generating a master control current; and wherein each delay buffer of the ring oscillator and at least one delay buffer of the serial chain provides a delay controlled by a first predetermined fraction of the master control current.

3. The circuit of claim 2, further comprising:

a digital-to-analog converter which receives the master control current and which, as a function of the delay word supplied, generates a secondary control current which is a second predetermined fraction of the master control current; and wherein at least one of the delay buffers of the serial chain is connected to receive and have its delay controlled by the secondary control current.

4. The circuit of claim 1, wherein the circuit selectively produces precompensated write data output and unprecompensated write data output, the circuit further comprising:

a second serial chain of delay buffers having an input connected to receive the write data, and having an unprecompensated write data output; and a switch connected to the precompensated write data output of the first serial chain of delay buffers and to the unprecompensated write data output of the second serial chain of delay buffers and producing as an output a selected one of the precompensated write data output and the unprecompensated write data output.

5. A write data precompensation circuit, comprising:

a first plurality of current-controlled delay buffers connected as a ring oscillator;

a second plurality of current-controlled delay buffers connected as a delay line having an input connected to receive the write data, and having taps after at least two of the second plurality of delay buffers;

a variable source of master control current, the master control current connected to control the delays of the first plurality of delay buffers; and a delay word decoder connected to receive a delay word and to receive the master control current, and having a plurality of select outputs responsive to the delay word received and a secondary control current output which is a function of the master control current and the delay word received, the select outputs connected to control which of the taps is an output tap and the secondary control current output connected to control the delay of the second plurality of delay buffers.

6. The circuit of claim 5, wherein the delay word decoder further comprises:

a digital-to-analog converter having a transfer function whose discrete output currents are the secondary control currents and wherein the discrete output currents control pairs of the second plurality of delay buffers to have delays which differ from each other by a constant value.

7. A method of performing write precompensation, comprising the steps of:

generating a master write clock using a current-controlled ring oscillator of first delay stages;

delaying write data through a plurality of second delay stages having delays which track those of the first delay stages;

controlling a current supplied to each second delay stage to be proportional to a current supplied to each first delay stage; and selecting as precompensated write data an output of one of the plurality of delay stages in the step of delaying.

8. The method of claim 7, wherein the step of controlling further comprises the steps of:

selecting the current supplied to each second delay stage from one of a plurality of currents which cause delays which differ from each other by equal values.

9. The method of claim 8, wherein the circuit selectively produces precompensated write data output and unprecompensated write data output, the method further comprising the steps of:

delaying write data through a plurality of third delay buffers; and selectively switching the output to carry one of the precompensated write data output and the unprecompensated write data output.

10. A circuit for delaying a data signal by a programmable fraction of a master clock period, the data signal having pulse edges synchronized with the master clock, the circuit comprising:

a current-controlled ring oscillator of delay elements, each delay element controlled by a first control current, the ring oscillator having an output carrying the master clock;

a control circuit having a delay code input and a first control current input, the delay code specifying the programmable fraction of the master clock period, and the control circuit producing a second control current output which is a predetermined fraction of the first control current dependent on the delay code input; and a first delay line of delay elements, the first delay line having an input connected to receive the data signal, each delay element of the delay line substantially identical to a delay element of the ring oscillator, each delay element of the delay line controlled by the second control current, the first delay line producing a first delayed output.

11. The circuit of claim 10, wherein the control circuit further produces a select output, further comprising:

a second delay line having an input connected to receive the data signal, and including at least one delay element substantially identical to a delay element of the ring oscillator and controlled by a third control current substantially equal to the first control current, the second delay line producing a second delayed output having a fixed delay; and wherein the select output of the control circuit selects as delayed data one of the first delayed output and the second delayed output.

12. The circuit of claim 10, wherein the ring oscillator is a current-to-frequency circuit in a phase-locked loop circuit.

13. The circuit of claim 10, wherein:

the control circuit further produces a select output; and the first delay line includes a plurality of delay elements having output taps therebetween, an output tap selected as the delayed data signal output by the select output of the control circuit.

14. The circuit of claim 13, wherein:

the ring oscillator includes an integer number N of delay elements;

the first delay line plurality of delay elements is an integer number M of delay elements; and when the first control current equals the second control current the delay between each output tap as a percentage of the master clock period is given by $(\frac{1}{2})(M/N) \cdot 100$.

15. The circuit of claim 14, wherein:

when the delay code input to the control circuit specifies a delay not equal to an integer multiple of $(\frac{1}{2})(M/N) \cdot 100$, the second control current is set to be a predetermined fraction of the first control current other than $\frac{1}{1}$.

16. A method of delaying input data by a programmable fraction of a master clock period, comprising the steps of:

generating input data synchronous with a master clock signal having the master clock period; and selectively delaying the input data by a predetermined delay which tracks the master clock period, the predetermined delay not derived from the master clock signal, thereby delaying the input data by a fixed percentage of the master clock period.

17. The method of claim 16, further comprising the steps of:

generating the master clock signal using a predetermined integrated circuit element; and providing a delay circuit having at least one delay element which tracks the master clock period because the delay element has a geometry related to that of the predetermined integrated circuit element.

* * * * *